(12) United States Patent
Landesberger et al.

(10) Patent No.: US 8,563,358 B2
(45) Date of Patent: Oct. 22, 2013

(54) METHOD OF PRODUCING A CHIP PACKAGE, AND CHIP PACKAGE

(75) Inventors: Christof Landesberger, Graefelfing (DE); Robert Faul, Munich (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 38 days.

(21) Appl. No.: 13/275,988

(22) Filed: Oct. 18, 2011

(65) Prior Publication Data

US 2012/0091594 A1 Apr. 19, 2012

(30) Foreign Application Priority Data

Oct. 18, 2010 (DE) .......................... 10 2010 042 567

(51) Int. Cl.
*H01L 21/00* (2006.01)
*H01L 23/52* (2006.01)

(52) U.S. Cl.
USPC ............ 438/106; 257/774; 257/E21.599; 257/E23.068

(58) Field of Classification Search
CPC ............... H01L 2924/01079; H01L 24/48091
USPC ........... 257/774, E21.599, E23.068; 438/113, 438/106, 107, 456
See application file for complete search history.

(56) References Cited

U.S. PATENT DOCUMENTS

| | | | |
|---|---|---|---|
| 5,290,624 A * | 3/1994 | Bujard | 428/209 |
| 6,100,804 A * | 8/2000 | Brady et al. | 340/572.7 |
| 6,309,912 B1 * | 10/2001 | Chiou et al. | 438/118 |
| 6,528,351 B1 | 3/2003 | Nathan et al. | |
| 6,606,247 B2 * | 8/2003 | Credelle et al. | 361/737 |
| 6,762,510 B2 | 7/2004 | Fock et al. | |
| 7,353,598 B2 * | 4/2008 | Craig et al. | 29/846 |
| 2003/0057525 A1 | 3/2003 | Fock et al. | |
| 2003/0057563 A1 | 3/2003 | Nathan et al. | |
| 2004/0054980 A1 * | 3/2004 | Perlov et al. | 716/19 |
| 2005/0093172 A1 | 5/2005 | Tsukahara et al. | |
| 2007/0031992 A1 * | 2/2007 | Schatz | 438/107 |
| 2007/0134849 A1 | 6/2007 | Vanfleteren et al. | |
| 2009/0137086 A1 * | 5/2009 | Otremba et al. | 438/127 |

FOREIGN PATENT DOCUMENTS

| | | |
|---|---|---|
| DE | 10122324 | 11/2002 |
| DE | 102005024431 | 11/2006 |
| DE | 102007020475 | 11/2008 |
| EP | 1230680 B1 | 11/2000 |
| WO | WO-01/24259 | 4/2001 |
| WO | WO-01/37338 | 5/2001 |

OTHER PUBLICATIONS

Marent, "Imec and University of Ghent present new concept for bendable packages ultra-thin chips", 2006, IMEC NES Archive Apr. 2006.*

* cited by examiner

*Primary Examiner* — Nikolay Yushin
(74) *Attorney, Agent, or Firm* — Michael A. Glenn; Perkins Coie LLP

(57) ABSTRACT

A method of producing a chip package includes providing a substrate comprising a first recess having a recess bottom and recess side walls. A chip comprising a chip backside is introduced into the recess such that the chip does not protrude from the recess and such that a gap remains between the recess side walls and the chip, the chip backside being attached to the recess bottom. The gap is filled with a filler material.

30 Claims, 11 Drawing Sheets

METHOD OF PRODUCING A CHIP PACKAGE, AND CHIP PACKAGE

CROSS-REFERENCE TO RELATED APPLICATIONS

This application claims priority from German Patent Application No. 10 2010 042 567.2, which was filed on Oct. 18, 2010, and is incorporated herein in its entirety by reference.

The present invention relates to a method of producing a chip package, and to a chip package. A chip package is understood to mean a chip housing having a chip arranged therein, it being possible for the housing to have external pads which are connected to contact areas (contact pads) of the chip. In particular, the invention relates to a method of producing a chip package and to a chip package which may be suitable for processing and assembling very thin chips having thicknesses of 10 µm to 50 µm.

BACKGROUND OF THE INVENTION

Very thin and, thus, elastic semiconductor devices—chips—enable many new microelectronic applications on curved or deformable surfaces. To be able to process and assemble very thin devices, e.g. having thicknesses of 10 µm to 50 µm, without any risk of breakage, they must be delivered in a corresponding package, which also enables deformation of a protective jacket (i.e. housing) and chip unit. The main task of a flexible package is to protect the very thin chip against environmental influences and mechanical breakage. A requirement placed upon electric functionality of a chip package for wire-bonded chips consists in leading contact areas of the chip out of the package and providing, on the outside of the package, new contact areas (pads) suited for adhesive or solder mounting of the package.

A flexible film package for a thin and elastic chip is known from DE 10 2006 044525 B3. This involves laminating a cover sheeting over a chip component glued onto a base film. This results in a film package having its largest thickness at the location of the component. This has the disadvantage that mechanical forces acting on the package from outside will act mainly on the fragile chip component. Winding the film package onto a roll, for example during a manufacturing or delivery process, results in bulges at the location of the chip. Thus, the pressure acts mainly on the components, which is why the risk of breakage during the further manufacturing process or during the lifetime of the product is high.

US 2005/0093172 A1 describes a chip package wherein a chip is embedded in a hot-melt adhesive. The chip is aligned in relation to conductive paths existing on a substrate, and is mounted (assembled). Subsequently, a spacer having an opening in the area of the chip and consisting of a thermoplastic resin is stacked with the substrate. Then a cover layer is applied thereon which also has a thermoplastic resin layer on its underside, whereupon the substrate and the cover are connected over the thermoplastic spacer layer by means of pressurized thermal connection. According to US 2005/0093172 A1, the chip must be contacted with the conductive paths by means of an adhesion while using an anisotropically conductive adhesive, or by means of a soldering process. To this end, a bonding process is necessary which requires a high level of adjustment accuracy for the chip and, thus, a large amount of equipment-related expenditure for the chip-bonding device. Both soldering and mounting by means of an anisotropically conductive adhesive additionally require more time, so that the method is not very fast. In addition, the chip must be placed upon the topography of an already existing conductive-path structure and must even be pressed during bonding. This is a risky process for very thin chips since during chip bonding there is no flat support, but only individual conductor tracks, so that the predefined bonding pressure is distributed in a very non-uniform manner, which results in a very high risk of breakage.

EP 1 230 680 B1 describes a method of embedding a thin semiconductor chip in printed circuit boards, i.e. rigid substrates. The chip is placed upon a lower printed circuit board plane, whereupon—for embedding the chip—a further printed circuit board plane is laminated over the chip onto the lower printed circuit board plane, and subsequently the entire structure is molded (pressed) by means of heat and pressure. The process sequence described is suitable for printed circuit board substrates, but is unsuitable for flexible films, and in particular is not at all suitable for a continuous process of roll-to-roll manufacturing.

Finally, U.S. Pat. No. 6,762,510 B2 and DE 101 22 324 A1 describe a method wherein a thin circuit wafer is transferred onto a flexible carrier film (support layer), for example a polyimide film. An entire circuit wafer is processed continuously, so that once the thin wafer has been diced (singulated), a flexible semiconductor chip results which has a polymeric cover which, however, can exist only on the topside and underside of the chip. Here, no fully enclosing package is produced for a thin semiconductor device, since the side walls of the chip are exposed once the wafer has been diced.

SUMMARY

Embodiments of the present invention provide for a method of producing a chip package and a chip package, which are suitable for flexible substrates and wherein a risk of chip breakage is reduced.

Embodiments of the invention provide a method of producing a chip package, comprising:
providing a substrate comprising a recess having a recess bottom and recess side walls in a first surface;
introducing a chip, which has a chip backside, into the recess such that the chip does not protrude from the recess and that a gap remains between the recess side walls and the chip, the chip backside being attached to the recess bottom; and
filling the gap with a filler material.

Embodiments of the invention provide a chip package comprising:
a substrate comprising a recess having a recess bottom and recess side walls in a surface thereof, wherein a conductive layer is arranged on the recess bottom; and
a chip having a planar chip backside which is attached to the recess bottom, wherein a chip frontside which is opposite the chip backside does not protrude from the recess, a gap being arranged between the side walls of the recess and the chip which is filled with a filler material,
wherein the substrate comprises a flexible one-layer or multi-layer substrate, and wherein the chip comprises a flexible semiconductor chip having a thickness which ranges from 10 µm to 75 µm.

In embodiments, the chip may be glued to the recess bottom. In alternative embodiments, the chip may be melted onto the recess bottom, for example when the recess bottom consists of a polymeric film.

Embodiments of the invention are based on the finding that a chip package may be advantageously produced in that a substrate is provided wherein a recess has already been provided, or is provided, the depth of which is equal to or larger than the thickness of the chip or the thickness of the chip and of an adhesive layer, so that the chip will not protrude from the recess once the chip has been introduced into the recess. A gap is provided between side walls of the recess and side walls of the chip, said gap being filled with a filler material, so that the chip is completely surrounded by the filler material at least laterally. A chip frontside may be coplanar with the first surface of the substrate, so that one or more contact areas arranged on the frontside of the chip may be exposed once the gap has been filled with the filler material. In alternative embodiments, the depth of the recess is larger than the thickness of the chip or the thickness of the chip and of the adhesive layer, so that the frontside of the chip is set back in relation to the first surface of the substrate; filling the gap with a filler material also includes introducing filler material into the free area of the recess on the frontside of the chip. The filler material arranged in the chip frontside may be patterned, in a subsequent step, so as to expose one or more contact areas arranged on the frontside of the chip.

In embodiments of the invention, the substrate comprises a flexible one-layer or multi-layer film-roll substrate, wherein the chip comprises a flexible semiconductor chip having a thickness which ranges from 10 μm to 75 μm, and wherein the method is performed in a roll-to-roll method.

In embodiments of the invention, a conductive layer is arranged on the recess bottom and the substrate comprises a flexible one-layer or multi-layer substrate, wherein the chip comprises a flexible semiconductor chip having a thickness which ranges from 10 μm to 75 μm.

In embodiments of the invention, the conductive layer on the recess bottom is not electrically connected to a contact area of the chip. In embodiments of the invention, the chip does not have a contact area on the backside thereof.

In embodiments of the invention, the thickness of the flexible semiconductor chip is in a range of 1 to 50 μm.

In embodiments, a planar adhesive layer may be formed between the chip backside and the recess bottom. In embodiments, the filler material may be distinguishable, on account of the manufacturing method, from the material of the substrate at least in that area in which the recess is formed. They may be different materials, for example.

In embodiments of the invention, contact areas with bumps arranged thereon may be provided on the chip frontside, it being possible for said bumps to protrude from the filler material after the filling process, or to be exposed by a short etching process.

Embodiments of the invention include producing a thin-film wiring metallization on that surface of the substrate which has the recess which connects one or more contact areas on the chip frontside with one or more external contact areas. The wiring metallization may thus be provided within the package in a planar manner, as it were, i.e. no topographical changes that go beyond the thickness of the thin film will be produced by the wiring metallization. External contact areas are understood to mean contact areas serving to create a connection to an external structure. In embodiments of the invention, contact areas may remain exposed on the chip frontside and may represent external contact areas. In embodiments of the invention, a conductive layer is provided on the recess bottom, the chip comprising, on the chip backside, a contact area glued to the adhesive layer by means of a conductive adhesive. The conductive layer may extend into areas outside the recess and may be connected to an external contact area, or terminal, via an opening in the substrate, said opening being filled with a conductive material.

In embodiments of the invention, further cover layers, wherein openings for exposing external contact areas may be formed, and/or protective layers may be provided. External protective layers may be provided in particular in that area in which the chip is arranged so as to additionally protect same.

In embodiments of the invention, the substrate may be a flexible substrate having a thickness of 20 μm to 150 μm, it being possible for the chip to be a flexible semiconductor device having a thickness of 10 μm to 75 μm or a thickness of 10 to 50 μm. Thus, embodiments of the invention enable fully flexible implementation, which also enables complete roll-to-roll processing, in particular. Alternative embodiments relate to rigid substrates and/or rigid chips or electronic components.

In embodiments of the invention, the chip is introduced into a recess formed in a substrate so that said chip need not be aligned with already existing conductive paths on a substrate and assembled. Rather, a planar chip backside may be glued to a planar recess bottom. In this context, planar means that no protruding conductive paths or other protruding structures are formed on the respective surfaces. Planar surfaces may be understood to mean such surfaces whose flatness imperfections amount to 10 μm at a maximum.

As compared to known procedures, the temporal sequence of chip assembly and chip contacting is reversed in embodiments of the invention, so that the process may be sped up and the risk of breakage may be minimized. In embodiments of the invention, the chip is placed into an existing cavity, and it is only the border joint around the chip that is filled with a filler material, for example a dielectric, which may be selected according to suitable mechanical properties. Embodiments of the invention enable continuous processing of film roll material.

Embodiments of the invention will be explained in more detail below with reference to the attached figures. In the figures, elements which are identical or have identical actions are designated by identical reference numerals, and repeated descriptions of said elements have been omitted where they are superfluous.

Figure 1:
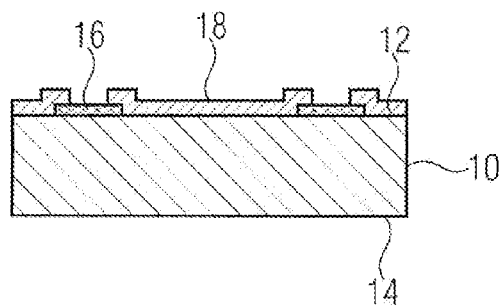
FIG. 1 shows a schematic cross-sectional view of an exemplary chip.

The expression "chip" as is used herein is typically understood to mean a semiconductor chip that may provide active and/or passive electronic functionality. Examples of such chips are IC chips (integrated circuit chips). As is shown in FIG. 1, a typical chip, for example an IC chip, in this context may have a chip substrate 10 comprising a first surface 12 and a second surface 14. In the vicinity of the first surface, components providing an electronic functionality may be integrated into the chip substrate 10, so that the first surface may be referred to as the main surface, whereas the second surface 14 may be referred to as the backside surface.

The main surface 12 has contact areas (pads) 16 provided thereon which are electrically coupled to the components providing the electronic functionality. In connection with IC chips, the contact areas 16 are typically also referred to as IC pads. Said IC pads typically consist of a metal such as Al, AlSi or AlSiCu, for example.

As is shown in FIG. 1, the main surface 12 of the chip substrate 10 is covered with a passivation layer 18, which leaves open at least regions of the contact areas 16 so as to be able to connect same electrically. The passivation layer 18 may consist of a dielectric, for example, such as silicon oxide or silicon nitride. As may be seen in FIG. 1, the contact areas 16 are located—in terms of the topography of the main surface—slightly lower down, i.e. by the layer thickness of the passivation layer 18 lower down, than the passivation surface. Typical IC chips have at least two contact areas on the main surface. Alternative IC chips have at least one contact area on the main surface and one contact area on the backside surface. Embodiments of the invention are suitable for producing chip packages for both types of chips.

Figure 2:
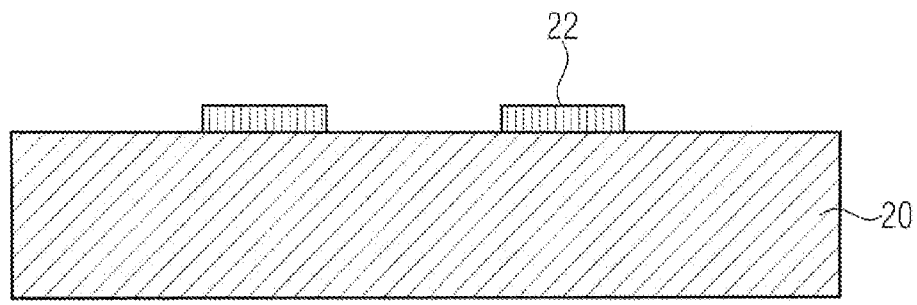
FIG. 2 shows a schematic cross-sectional view of an exemplary carrier substrate.

According to the prior art, flip-chip mounting of IC chips is known wherein an electrical connection is produced, by means of a conductive material, between chip contact areas and a highly electrically conductive layer of a housing environment. As is shown in FIG. 2, an IC housing environment may consist of a carrier substrate 20 which has conductive paths 22 arranged thereon. The conductive paths 22 form a topography on the substrate 20 which corresponds to the thickness of the material forming the conductive paths.

According to the prior art, two essential connection techniques are known for such flip-chip mounting, namely soldering while using solder balls, or utilization of micro bumps for a connection with a conductive adhesive. Solder balls are common geometrically in an order of magnitude of about 100 μm, the smallest solder balls that are being developed having a diameter of about 40 μm. Said order of magnitude is not very suitable for a film technique.

Figure 3:
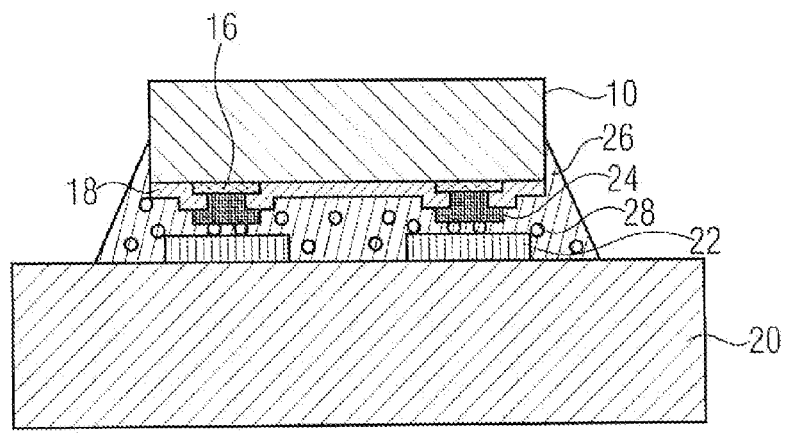
FIG. 3 shows a schematic cross-sectional view of a chip assembled onto a substrate.

The method known from the prior art which comprises micro bumps and adhesive may result in thinner arrangements than utilization of solder balls and is schematically shown in FIG. 3. In FIG. 3, a chip as is shown in FIG. 1 is bonded upside down onto a substrate 20 as is shown in FIG. 2. As may be seen, the contact areas 16 have micro bumps 24 provided thereon which may also be referred to as under-bump metallization. Said micro bumps, which may consist of a metallic material for example, protrude beyond the passivation layer 18. Thus, conductive material portions 28, which are arranged in an adhesive 26 and may be referred to as fillers, may create electric contact between the micro bumps 24 and the conductive paths 22. For the connection technique between the micro bumps 24 and the conductive paths 22, a combination of pressure and temperature is required, so that as an inevitable consequence of the mounting process the compressive stress creates a non-uniform mechanical load in contact-area regions and non-contact-area regions on the chip. With thinned chips, said non-uniform load may result in damages that may either immediately result in functional defects or in premature failures during the operating phases of the chips.

Embodiments of the present invention provide methods of producing chip packages as well as chip packages that may reduce such functional defects and failures. Steps of embodiments in accordance with the invention will now be explained with regard to FIGS. 4A to 4K.

Initially, a film substrate 30 is provided. The film substrate 30 has a first surface 32 and an opposite second surface 33, which represent the surfaces having the largest surface areas of the substrate 30. The first surface 32 has a recess, or relief, 34 formed therein which comprises a recess bottom 36 and recess side walls 38. In a top view, the recess 34 may have a square or rectangular shape, for example, which may be adapted to the shape of a chip to be inserted. The depth T of the recess (perpendicular to the surfaces 32, 33) is selected such that it corresponds at least to the thickness of a chip to be inserted, including the adhesive layer underneath the chip. In embodiments, the depth T may be slightly larger than the thickness of the chip including the adhesive layer, "slightly larger" referring to an order of magnitude of 5-20 μm, for example 10 μm.

Figure 4A:
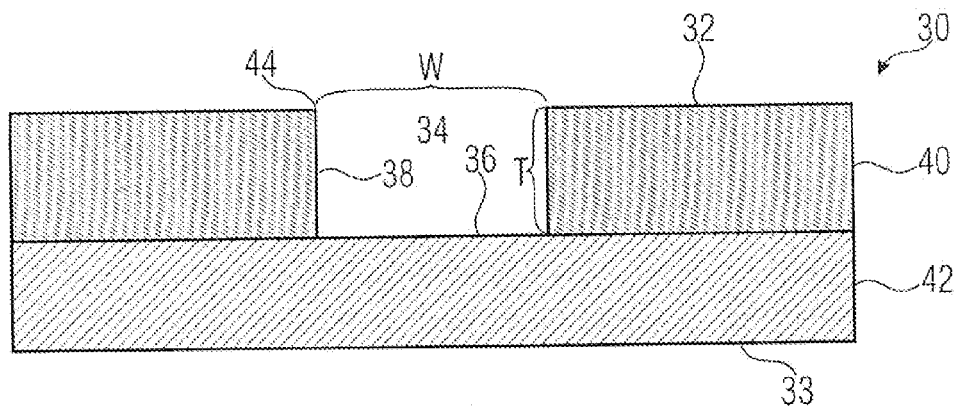
FIGS. 4A to 4K show schematic cross-sectional views for illustrating steps of an embodiment for producing a chip package.

As is shown in FIG. 4A, the film substrate 30 has a first layer 40 and a second layer 42, the recess 34 being formed in the first layer and extending to the second layer. The substrate 30 may be produced, for example, by laminating a photopatternable dielectric, for example a dry resist, in a suitable thickness, or by means of doctor coating using photopatternable benzocyclobutene (BCB) or photopatternable polyhydroxystyrene (PHS), Ormocer or patternable epoxy resins, such as polydimethylsiloxane (PDMS) or SU8 photoresist, onto the second layer 42, which may be a plastic film. The first layer 40 may then be lithographically patterned, i.e. exposed and developed, so that the recess 34 is produced with a geometrically defined edge. In this manner, the corners of the recess 34 may be utilized as adjustment marks for further lithographic processes, as will be explained below.

It need not be specifically mentioned that in embodiments of the invention a plurality of chip packages may be produced in parallel which will be subsequently diced. In this manner, a plurality of recesses 34 may be formed in the first layer 40.

In embodiments, the opening width W of the recess 34 may be 50 μm to 5 mm larger than the corresponding external dimensions of the component or chip to be introduced into the recess, so that on each side of the chip, a gap width of between 25 μm and 2.5 mm results. In embodiments, a gap width may amount to 0.1 mm to 0.5 mm on each side of the chip.

Alternatively to the method described, the recess may also be produced by such processes as hot embossing, micro milling, micro injection molding and the like. As another alternative, the substrate film 30 having one or more recesses in a surface of same may be produced by laminating two films together, one of the films already having openings therein. Such openings may be punched, lasered or cut. For said laminating, adhesives or adhesive-coated films may be used. In addition, melting two plastic films together may be advantageous, which may include, for example, directly welding two films made of polyethylene terephthalate (PET) under the application of pressure and temperature. Possible film materials are polyethylene terephthalate, polyimide, polyethylene naphthalate, LCP (liquid crystal polymer), polycarbonate, polystyrene and the like.

Figure 4B:
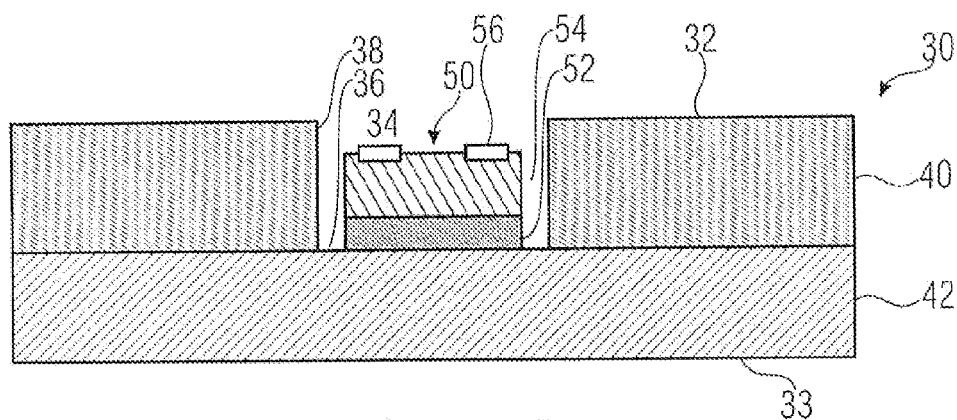

As is shown in FIG. 4B, once the substrate 30 has been provided, a component in the form of a chip 50 is introduced into the recess 34. The chip 50 is glued, with its backside, onto the recess floor 36 via an adhesive layer 52. A gap 54 remains between the sides of the chip 50 and the side walls of the recess 34. The chip 50 is introduced into the recess 34 in a central position, so that the same gap 54 remains on all sides thereof. Both the chip backside and the recess bottom may be configured to be planar, so that a planar adhesive layer is formed between the chip backside and the recess bottom.

As is schematically shown in FIG. 4B, the chip 50 is introduced into the recess 34 such that contact areas 56 on the chip are aligned upward, i.e. are arranged on the frontside—facing the first surface 32—of the chip. As was described above, the contact areas 56 may be lowered by default, for example by means of passivation layers of the chip which are higher than the contact area surface, or may be equipped with so-called micro bumps (under-bump metallization), i.e. comprise protruding metal bumps that may consist of solder metals, for example, such as Au, Ni, Cu or Ti.

In order to glue the chip 50 into the recess 34, adhesive may have already been introduced into the recess in advance, for example by means of dispensing, jetting, dripping or screen-printing. Alternatively, the adhesive 52 may have been applied onto the backside of the component 50. With the second variant, so-called DAF (die-attached film) tapes may advantageously be used which are sawing films having an epoxy resin coating. If a wafer is sawn on a DAF tape, and if the individual chip is picked off thereafter, the adhesive coating continues to adhere to the chip backside and may then be exploited for gluing the chip into the recess. In embodiments, a low yet defined thickness of the adhesive layer within the range from 5 µm to 30 µm is advantageous.

Figure 4C:
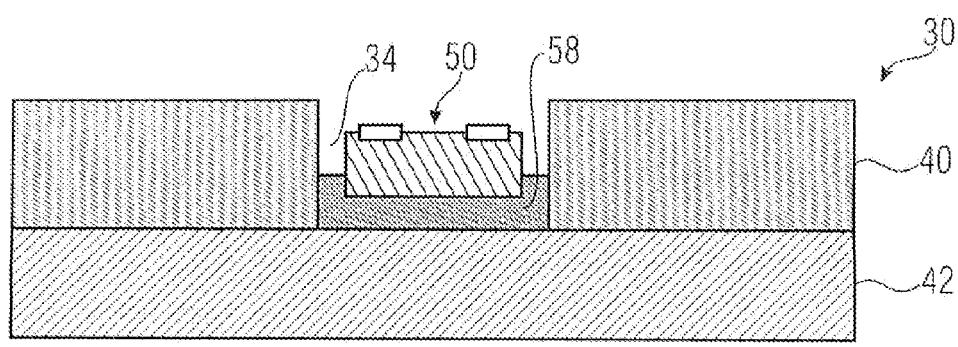

As is shown in FIG. 4C, liquid adhesive 58 may alternatively be introduced into the recess 34, whereupon the chip 50 is placed onto the liquid adhesive 58. The chip 50 may float on the surface of the liquid adhesive 58 and will automatically align itself at the center of the recess 34 due to capillary forces. This facilitates and accelerates deposition of the chips at the destination; simply dropping the chips over the recesses may also be sufficient for component placement. The liquid adhesive may also be introduced into the recesses in the sense of a self-assembling process. To this end, for example, the second layer 42, which forms the recess bottom, may exhibit a utilization behavior that is contrary to that of the top side of the first layer 40 which has the recess formed therein. For example, the recess bottom may be hydrophilic, whereas the top is hydrophobic. In alternative embodiments, the recess bottom may be oleophilic, whereas the top is oleophobic. A liquid that can only wet the bottom will not stay at the top, or will withdraw into the recesses. In this manner, the task of a suitable adhesive may be self-assembling.

In alternative embodiments, the chip may have a backside contact which may be integrated into the chip backside such that the latter is planar. Alternatively, the entire surface area of the backside contact may be formed on the chip backside. In such embodiments, a metallization layer, which may consist of Cu, Au or Al, for example, may be provided between the first layer 40 and the second layer 42. The metallization layer may be deposited onto the second layer 42, for example. In such a case, a backside contact on the chip may be glued, while using a conductive adhesive, for example a silver paste, onto the metallization layer arranged on the bottom of the recess, and may thus be connected to same in an electrically conductive manner. Chips having backside contacts occur, in particular, in the fields of LED, individual semiconductors or RFID chips.

As is shown in FIG. 4C, the chip 50 may slightly sink into or be pressed into the liquid adhesive 58.

Figure 4D:
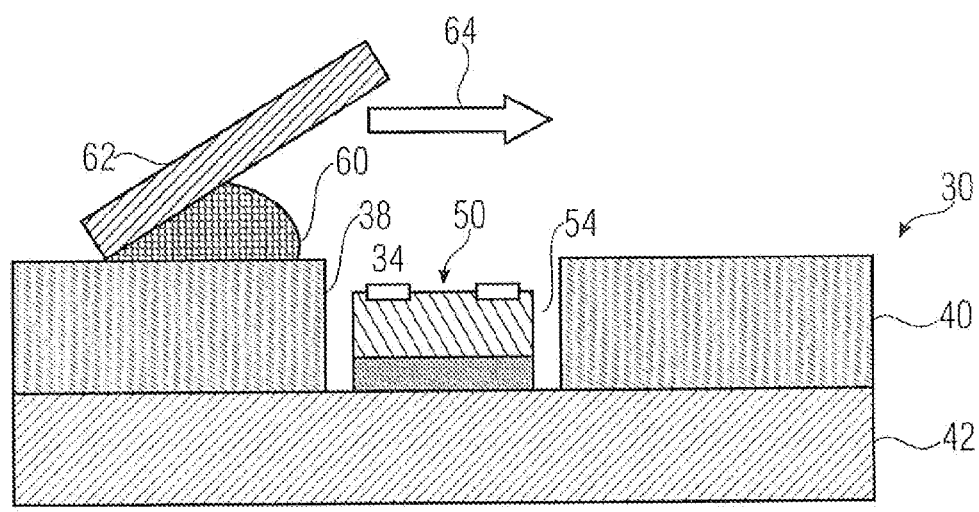

Once the chip 50 has been arranged, or has arranged itself, in a central position within the recess 34, so that a gap 54 will surround the chip 50, the gap 54 between the chip component 50 and the side wall 38 of the recess 34 is filled with a filler material 60. In embodiments of the invention, the entire surface area of the substrate 30 may be subjected to doctor coating, as is shown in FIG. 4D. This will be possible only if the chip 50 is slightly thinner than the depth of the opening, so that a doctor blade 62 may be supported on the layer 40 during movement 64 over the substrate 30. In this manner, only the minimally required amount of the filler material 60 is consumed. Adjusted application of the filler material 60 is not necessary here, which enables considerable simplifications in terms of processes and equipment.

In embodiments of the invention, the filler material 60 may be photopatternable materials such as photoresist, benzocyclobutene (BCB), PHS (polyhydroxystyrene), polyimide, polydimethylsiloxane (PDMS), Ormocer, and the like. Non-photopatternable materials are also possible, for example adhesives, polymers, resins, etc. Doctor-blading the filler material into the recess 34 and, thus, into the gap 54 may be improved by arranging the doctor blade at an oblique angle in relation to the orientation of the recesses.

Figure 4E:
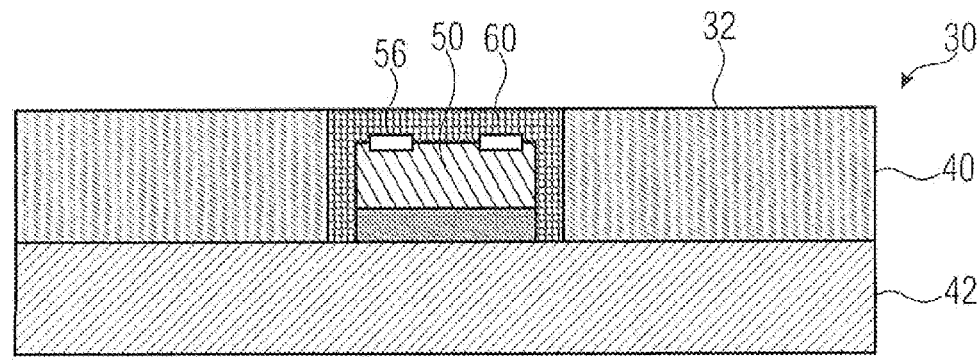

The resulting structure, wherein the chip 50 is glued into the recess 40 and the recess 34 is filled with filler material 60, is shown in FIG. 4E. Possibly, curing (hardening) of the filler material may be required. This may also be effected by heating the substrate, for example in a continuous furnace or by means of IR irradiation. In the case of UV-curing filler materials, which are preferably dielectrics, the substrate, which may be a transparent film substrate, may be irradiated with UV light on both sides, which assists in completely curing the relatively large material thickness within the gap, i.e. within the border joint, in a fast and complete manner. A plane-parallel substrate configuration as is shown in FIG. 4E results, which is useful for continuous roll-to-roll processing of the substrate, in particular with film substrates.

As may be seen in FIG. 4E, filler material 60 is arranged over the contact areas 56 on the frontside of the chip 50, i.e. on that side which faces the first surface 32 of the substrate 30. To expose the contact areas 56, the filler material 60 arranged on the frontside of the chip 50 is patterned in a subsequent step, as may be seen in FIG. 4F. This patterning includes removing the filler material 60 directly above the locations of the contact areas 56 to produce openings 68. If the filler material is a photopatternable dielectric, patterning may be effected by using a lithography process wherein a photomask is adjusted and exposed, and by means of the development process, the filler material over the contact areas 56 is removed. The corners of the recess 34, which are defined by the geometrically defined edges 44 thereof, may be used for adjusting the photomask. If no photopatternable filler material is used, a photoresist layer is initially deposited, for example by means of doctor coating or as a dry film resist. Said photoresist layer may be developed via a lithography process, whereupon the underlying filler material over the contact areas is etched away or dissolved. Corners of the recess or, if the filler material is transparent, also corners and/or edges of the chip 50 may be used for adjustment in each case.

Figure 4F:
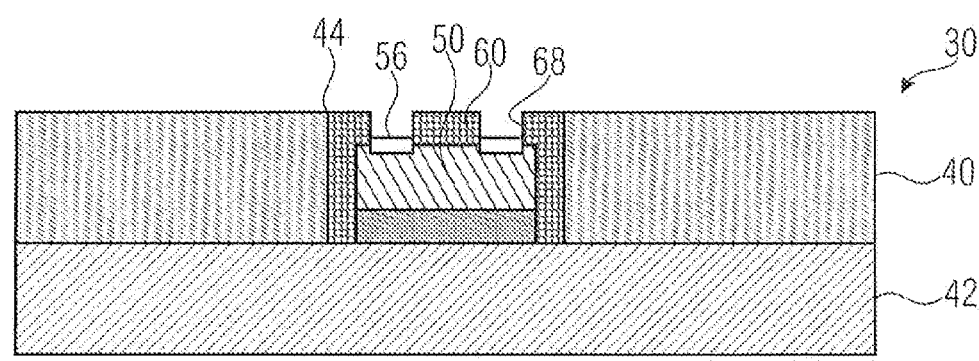
Figure 4G:
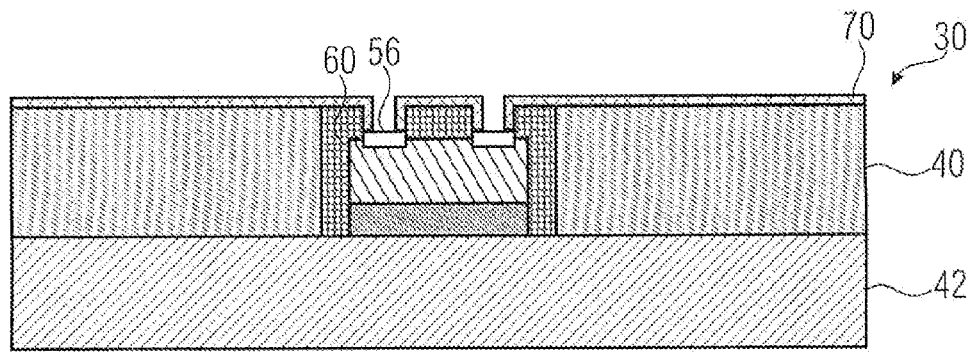

Starting from the structure shown in FIG. 4F, wherein the openings 68 are formed in the filler material arranged on the frontside of the chip 50, a metallization layer 70 is deposited on the first layer 40, the filler material 60 and the exposed regions of the contact areas 56. The metallization layer 70 may be produced, for example, by means of sputtering (PVD) or vapor-depositing an all-over layer. This involves also coating the side walls of the filler material and the contact areas and connecting them in an electrically conductive manner, as is shown in FIG. 4G.

Figure 4H:
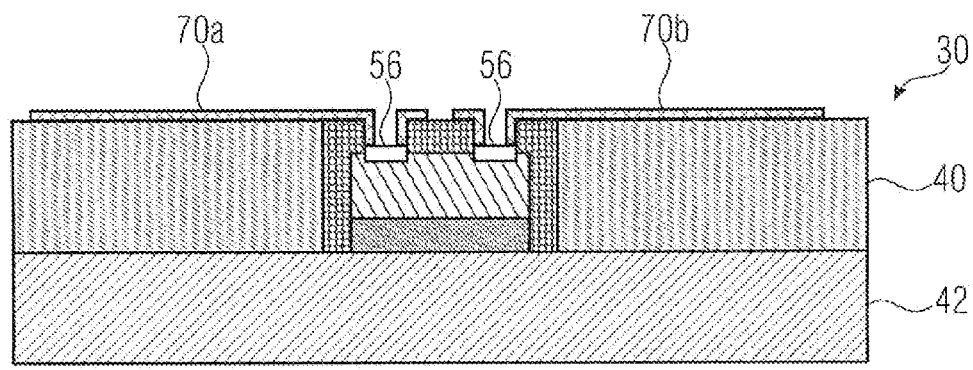

Subsequently, the metallization layer is patterned, as is shown in FIG. 4H, to produce metallization regions 70a and 70b, one of which being connected to each of the contact areas 56 of the chip 50. Patterning of the metallization layer 70 may be effected, for example, by means of resist deposition (coating or dry-film laminating) and a lithography process using a mask technique and a subsequent etching step. The photoresist layer is removed again after the metal etching.

Patterning of the metallization layer 70 connects the contact areas 56, which have pad sizes of from 20 µm to 150 µm, to metal areas 74, 76 located further out and having sizes of 0.2 mm to 5 mm on the first layer 40, which eventually are to be used as external contact areas (external contacts) for the chip package. Thus, it is the task of said patterning technique to expand a very tight contact area raster (grid) on the chip into a large raster for the package by means of rewiring. For the external contacts, matrix arrangements and/or multi-row contact areas may also be realized, which may later on be used for flip-chip mounting of the chip package, for example.

In alternative embodiments, it is possible to interconnect several chips within a film package and to subsequently embed them. In other words, in embodiments of the invention, a substrate may be provided which has several recesses in a surface of same, one chip being introduced into each of the recesses, it then being possible for pads of the respective chips to be connected to one another and/or to the external contact areas by means of patterning a metallization layer in accordance with the above explanations.

Once the metallization layer has been patterned, it can also be reinforced, for example by means of electrodeposition or electroless deposition of gold, copper or nickel. Thus, conductive paths having a relatively thick metal layer, for example up to 30 µm, may result which have a correspondingly higher current-carrying capability.

Figure 4I:
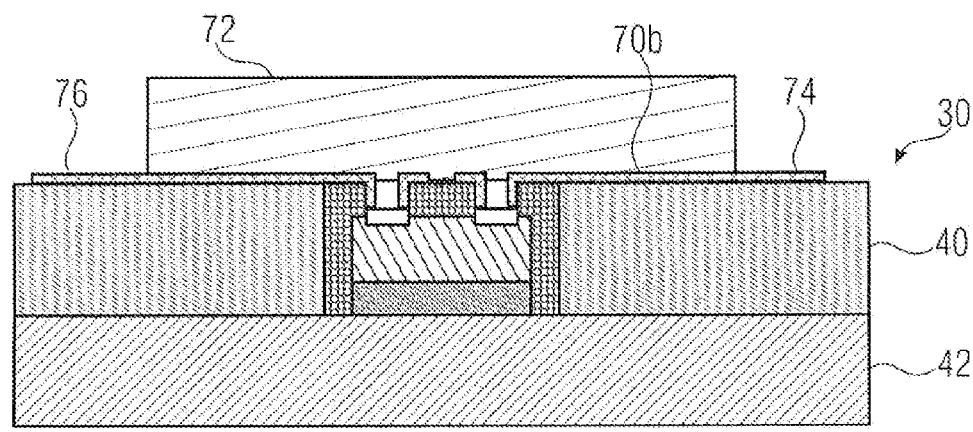

As is shown in FIG. 4I, a cover layer 72 is subsequently laminated over the regions of the chip mounting as a protective film. If the external contact areas, which are referred to by reference numerals 74 and 76 by way of example in FIG. 4I, are arranged only on two opposite sides, and if said two opposite sides are located in parallel with the length of a substrate band having several corresponding structures arranged one behind the other, the protective film may be laminated in a continuous process and without major adjustment requirements, the external contact areas remaining exposed, as is shown in FIG. 4I.

Figure 4J:
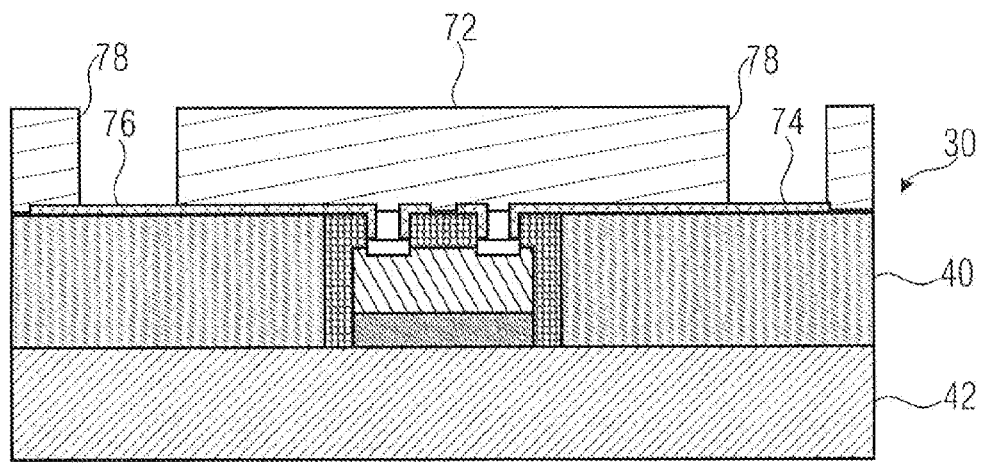

Alternatively, a protective layer 72 may be applied which has openings 78 which expose the external contact areas 74 and 76. For example, an all-over protective film 72 may be laminated on which already has openings 78, which will then be placed precisely over the external contact areas 74 and 76 of the film package. The openings 78 may be punched, for example. Alternatively, the openings in the protective film 72 may be exposed after laminating, for example by means of laser processing. A corresponding structure having openings 78 in the cover layer 72 is shown in FIG. 4j.

Figure 4K:
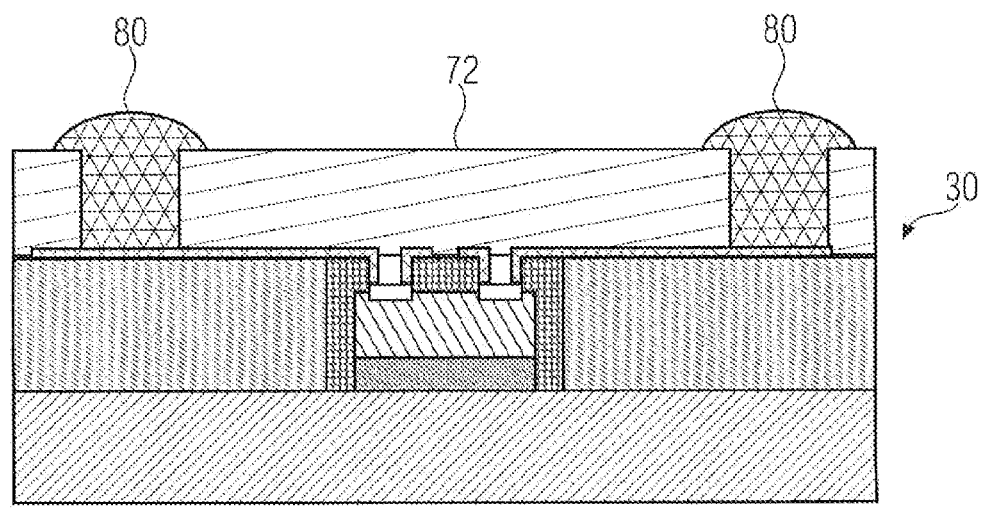

Following this, a metallization 80, for example a solder metallization, may be introduced into the openings 78. Such a metallization may be applied by means of screen or stencil printing, for example. The resulting structure is shown in FIG. 4K. Corresponding metallizations may also be applied to the external contact areas 74 and 76 shown in FIG. 4I.

Figure 5A:
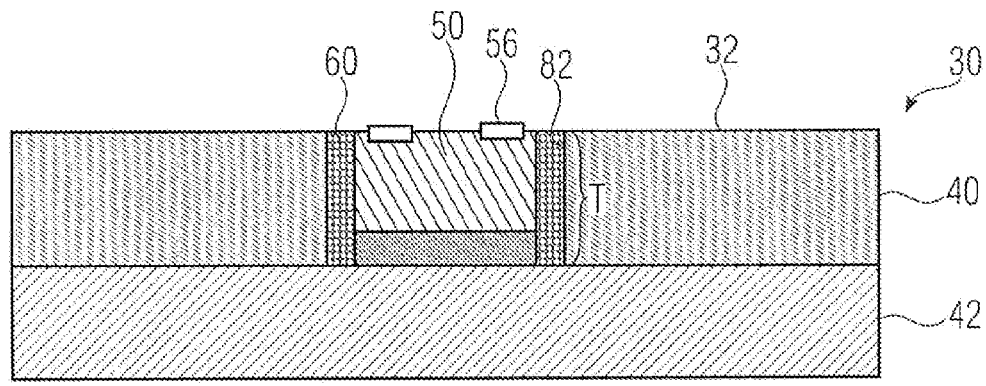
FIGS. 5A and 5B show schematic cross-sectional views for illustrating steps of an alternative embodiment.
Figure 5B:
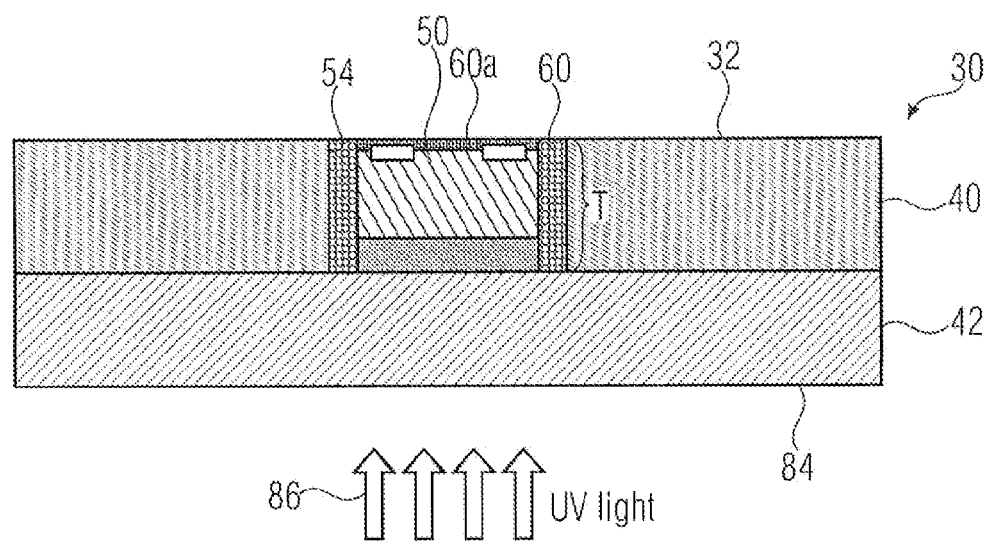

With reference to FIGS. 5A and 5B, a variant of an inventive method and/or of an inventive chip package will now be described wherein the frontside of the chip 50 is arranged to be essentially coplanar with the surface of the first layer 40 of the substrate 30. FIGS. 5A and 5B represent an intermediate product, wherein the chip 50 is introduced into a recess 82 within the first layer 40, the depth T of the recess corresponding to the combined thickness of the chip 50 and of the adhesive layer 52. Thus, the frontside of the chip 50, on which the contact areas 56 are arranged, is essentially coplanar with the first surface 32 of the substrate 30. In such a case, a doctor-coating step as was described above with reference to FIG. 4D would fill the border joint around the chip with filler material 60, but would not at all or only to a very limited extent coat the frontside of the chip with filler material, FIG. 5A showing a case wherein the frontside of the chip 50 is not coated at all. In such a case, one may directly proceed with depositing the metallization layer 70, as was described above with reference to FIG. 4G.

FIG. 5B shows a case wherein the frontside of the chip 50 is slightly set back in relation to the first surface 32 of the substrate 30, so that once the border gap 54 has been filled with the filler material 60, a thin layer of the filler material will remain on the frontside of the chip 50. In such a case wherein only a thin layer, for example having a thickness of around 10 µm, of the filler material remains on the top of the chip, it may be advantageous to perform curing starting from a second surface 84 of the substrate 30, which surface 84 is located opposite the first surface 32, so that only the filler material within the gaps 54 is cured, but the filler material on the chip frontside 50 is not, since the chip acts as a shadow mask. When using a UV-curing filler material, for example, UV irradiation may be effected only from the bottom through a transparent film, as is indicated by a UV light 86 in FIG. 5B. In this context, the chip 50 acts as a shadow mask, so that the filler material arranged on the frontside of the chip 50 is not cured. Following such bottom curing or irradiation, any undesired filler material (dielectric) may be simply washed off from the chip frontside or be removed using a solvent. Thus, in embodiments of the invention, a self-adjusting embedding process for the chip may be obtained. The filler material on the frontside of the chip 50 is schematically designated by reference numeral 60a in FIG. 5B.

In embodiments of the invention, a plurality of corresponding structures are produced in a laminate and subsequently diced. Once the protective layer 72 has been applied, for example in the form of a film or of a polymer deposited by means of doctor coating, the individual chip packages may be diced by cutting, punching or lasering. Due to the flexible cover on both sides, the chip is well protected. The chip package may now be connected to a source of energy and is immediately ready for operation. However, it may also be placed onto a further film substrate or onto a rigid carrier plate, for example in the form of a printed circuit board. By means of conductive gluing, for example while using adhesives filled with silver, or by means of soldering, electric connections with the environment may be readily implemented.

In addition to the embedded chip(s), further devices such as resistors, conductance coils, capacitors, electromechanical elements, micromechanical elements, microfluidic elements, optical elements and the like may be performed on the laminate in embodiments of the invention. In addition, the inventive structures are also suited for stacking such chip packages—which in embodiments may have the form of film packages, as has been described—one on top of the other, so that a three-dimensional package arrangement is created.

Embodiments of the invention will be explained in more detail below with reference to FIGS. 6 to 8 on the basis of utilization of a chip as is shown in FIG. 1 above.

Figure 6:
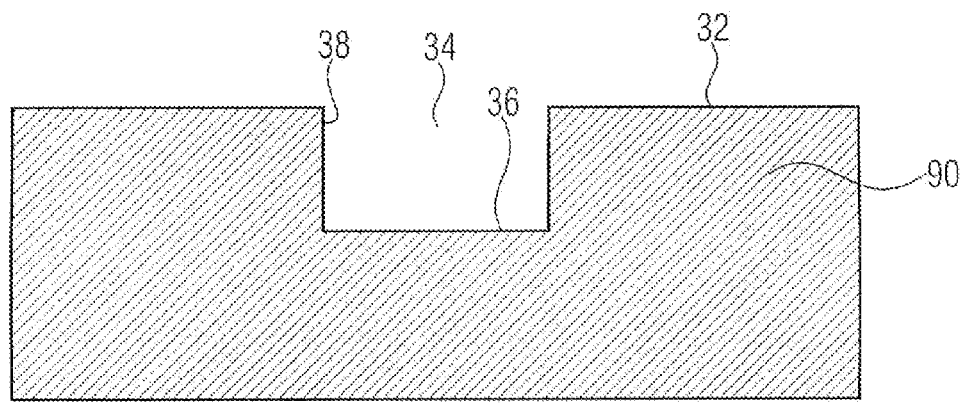
FIG. 6 shows a schematic cross-sectional view of an embodiment of a substrate.

FIG. 6 shows a schematic cross-sectional representation of a one-layer substrate 90 which in a first surface 32 of same has a recess 34 comprising a planar recess bottom 36 and recess walls 38. Such a substrate may be created while using a lithography method for example by patterning the first surface 32 of same.

Figure 7A:
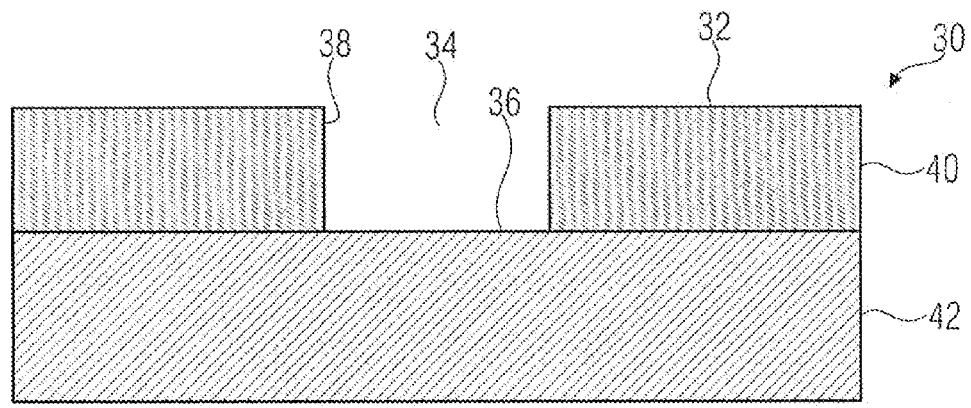
FIGS. 7A to 7E show schematic cross-sectional views for illustrating steps of alternative embodiments of a method of producing a chip package.
Figure 7B:
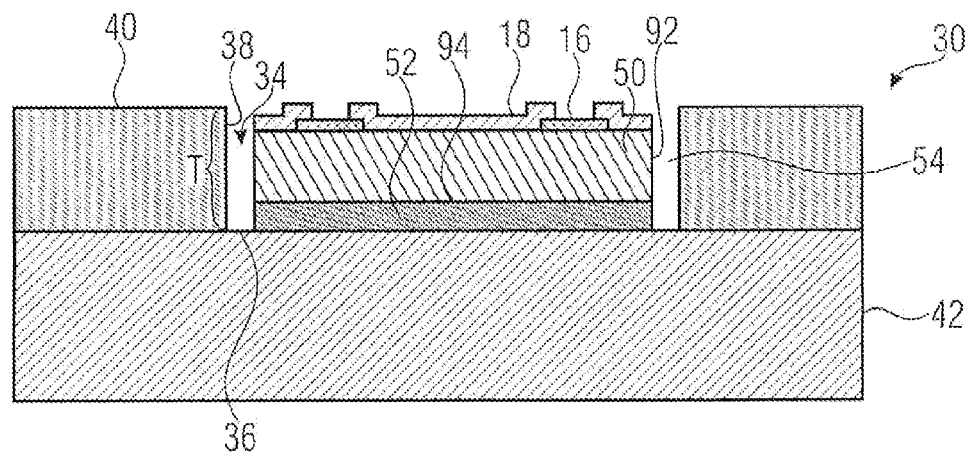

Alternatively, a two-layer substrate may be used as is shown in FIG. 7A, the recess 34 in the first layer 40 being formed in the first layer 40 and extending to the second layer 42. The substrate shown in FIG. 7A may thus correspond to the substrate shown in FIG. 4A, the substrate 30 having a substrate thickness in the order of magnitude of 80 µm to 150 µm, for example from 90 µm to 110 µm. In its geometric, lateral dimension, the recess 34 is again matched to the size of a chip to be introduced, so that once the chip has been inserted, a gap 54 having a matched width will remain between chip edges 92 and the side walls 38 of the recess 34, as is shown in FIG. 7B. Again, the chip 50 is glued to the planar recess bottom 36 with a planar backside 94 of same via an adhesive layer 52. As is further shown in FIG. 7B, the chip 50 has—on the frontside of same—contact areas 16 and a passivation layer 18, as was explained above with reference to FIG. 1. As is shown in FIG. 7B, the depth T of the recess is adapted to the thickness of the chip 50 plus the layer thickness of the adhesive layer 52. A thickness of the chip 50 including the adhesive layer 52 may be in an order of magnitude of 50 µm to 100 µm and in particular in an order of magnitude of 65 µm to 85 µm.

Figure 7C:
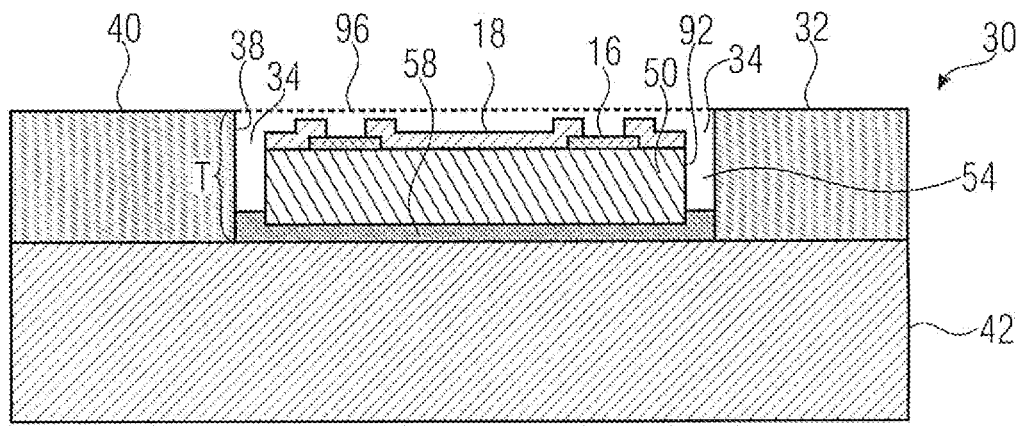

An alternative embodiment, wherein a corresponding chip having contact areas 16 and a passivation layer 18 on a frontside of same is pressed into an adhesive layer 58, is shown in FIG. 7C. In this structure, the depth T of the recess 34 is slightly larger than the combination of the thickness of the chip 50 and the thickness of the underlying adhesive layer 58, so that the frontside of the chip 50 is set back in relation to the first surface 32 of the substrate 30, as is indicated by a dashed line 96 in FIG. 7C.

Starting from the structure shown in FIGS. 7B and/or 7C, a filler material is introduced into the gap 54, for example by means of a doctor-coating method.

Figure 7D:
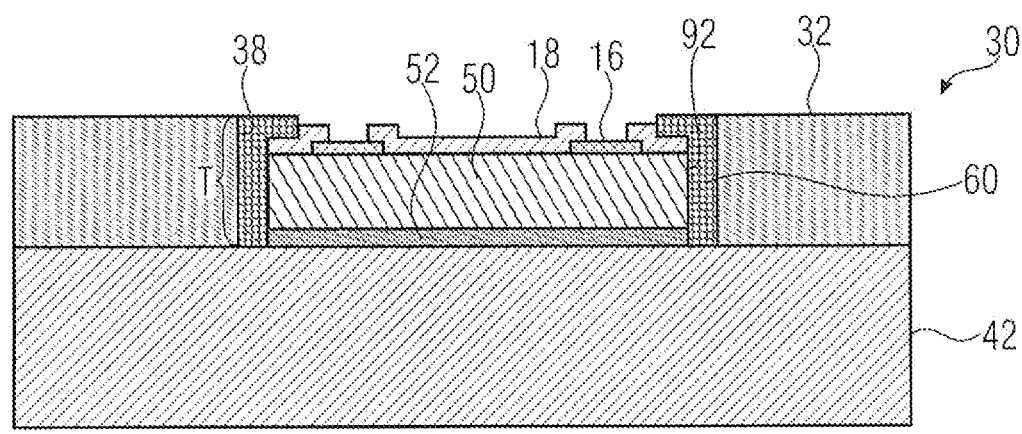
Figure 7E:
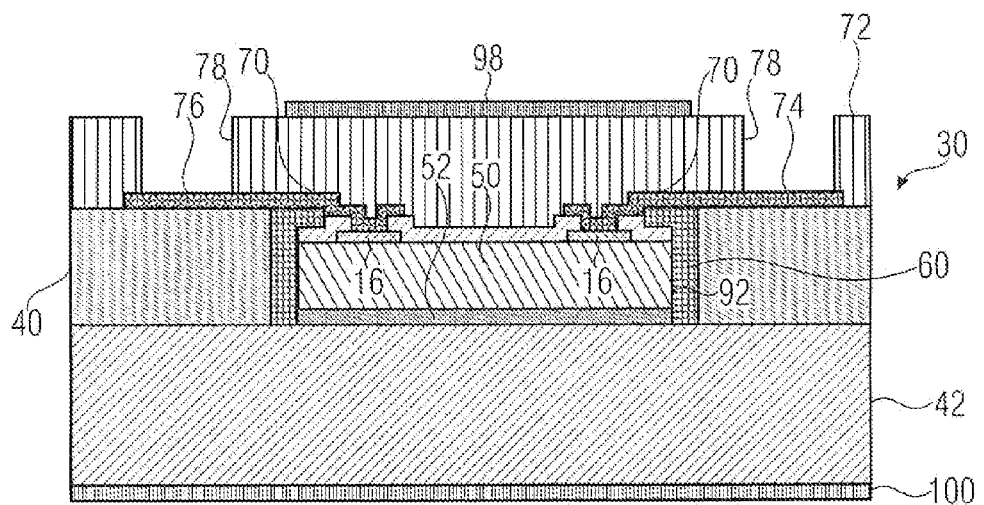

In the example shown in FIG. 7D, the adhesive layer 52 is provided only on the underside of the chip 50, and the depth T is slightly larger than the combined thickness of the chip and the adhesive layer. When the gap 54 is filled with the filler material 60, the free region, arranged on the frontside of the chip 50, of the recess 34 is also filled with the filler material, the filler material 60 subsequently being patterned so as to expose at least the contact areas 16. As is shown in FIG. 7D, the filler material 60 may also be patterned such that essentially the entire top of the chip 50 is exposed.

In embodiments of the invention, the circumferential gap between the chip edge 92 and the recess side wall 38 is thus filled up with a filler material—which preferably is electrically poorly conductive or non-conductive—such that it is largely level with the first surface 32 of the substrate 30. Largely level may be understood to mean a height difference in the order of magnitude of 10 µm. On the basis of the structure shown in FIG. 7D, in turn, a metallization layer 70 may be deposited and patterned so as to connect the contact areas 16 to external contact areas 74 and 76 in an electrically conductive manner. As is further shown in FIG. 7E, a cover layer 72 is again deposited onto the first area and the metallization layer 70 and is provided with openings 78 in the region of the external pads 74 and 76. In the embodiment shown in FIG. 7E, protective layers 98 and 100, which consist of metal for example, are provided on both sides of the laminate, the protective layer being deposited over the entire surface area, whereas the protective layer 98 is provided in that region which leaves open at least the contact regions 74, 76. Leaving open the contact regions 74, 76 is also to be understood to mean that a small distance zone around the regions 74 and 76 is not covered with the protective layer 98. The protective layers 98 and/or 100 may be formed of a metal, an inorganic or an organic material. The protective layers 98 and/or 100 may serve to shield off humidity, as a diffuse barrier, or for screening off external electric fields and radiation.

Figure 8:
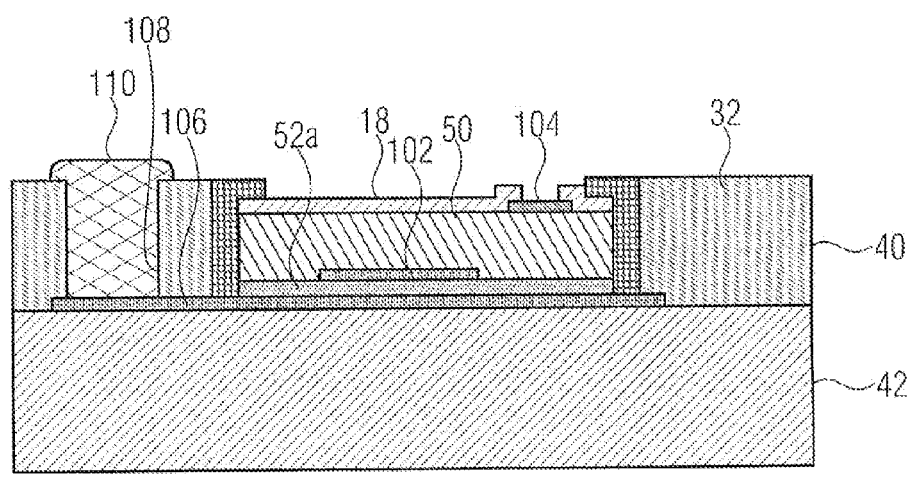
FIG. 8 shows a schematic cross-sectional view of an embodiment of a chip package.

FIG. 8 shows an alternative embodiment of a chip package wherein a contact area 102 is provided on a backside of the chip 50, and a contact area 104 of the frontside of the chip 50 is provided, which also has a passivation layer 18 arranged thereon. The contact area may be formed by a highly doped semiconductor region or may be formed over the entire area of the backside of the chip, so that the chip backside is planar. A manufacturing method of manufacturing a corresponding chip package may correspond to the above-described manufacturing methods except that a conductive layer 106 is arranged between the first layer 40 and the second layer 42, said conductive layer 106 being connected to the contact area 102 on the backside of the chip 50 via a conductive adhesive layer 52a. In addition, in the embodiment shown in FIG. 8, an opening 108 is formed in the first layer 40 outside the recess within which the chip 50 is arranged, said opening 108 extending to the conductive layer 106. The opening 108 has a conductive material 110 arranged therein which extends to the first surface 32 of the first layer 40, so that an electrical contact may be established, via the conductive material 110, to the contact area 102 on the backside of the chip 50.

On the basis of the structure shown in FIG. 8, a metallization layer may again be performed for electrically connecting the contact area 104 of the contact formed by the conductive material 110 to external contact areas, whereupon one or more protective layers may again be deposited as has been described above.

As the chip package, one may use both a structure wherein no further cover layer is provided over the embedded chip, as is shown in FIG. 5A, 5B, 7D, or 8 for example, and a structure having one or more such cover layers.

Embodiments of inventive topologies of chip packages thus include a one-layer or multi-layer substrate containing at least one depression for receiving a chip, in particular an IC chip. In particular, the backside of the chip and a bottom of the recess may be configured to be planar. The substrate may be a flexible substrate having a substrate thickness in the order of magnitude of 50 µm to 150 µm, 80 µm to 120 µm, or in the order of magnitude of 100 µm. In the geometric, lateral dimension, the recess is matched to the size of the chip, so that with the chip inserted, a matched gap width remains between the chip edge and the side wall of the recess in the substrate. The recess has an adhesive layer located therein which is yielded in a largely topography-free manner on the chip backside when the chip is inserted; a chip, in particular an IC chip, being inserted onto the adhesive layer with its backside into the recess. In its depth dimension, the recess is adapted to the thickness of the chip in addition to the layer thickness of the adhesive layer, or can be larger than said combined thickness. The thickness of the IC chip including the adhesive layer may be in the order of magnitude of from 50 µm to 100 µm, from 60 µm to 90 µm, or from 70 µm to 80 µm. A gap extending around the chip and running between the chip edge and the recess side wall is thus filled up with a material—which is electrically poorly conductive or non-conductive—such that it is largely level with the main surface of the substrate. "Largely level" may be understood to mean height differences of 10 µm at the most. That surface of the substrate which has the recess formed thereon has an electrically highly conductive layer provided thereon which, on the one hand, contacts one or more contact areas on the chip and, on the other hand, establishes an electrical connection with external contact areas on the main surface of the substrate. At least in the geometrical region of the contact areas, the gap-filler material is not present on the frontside of the chip.

Embodiments of the invention may be implemented while using rigid substrates such as printed circuit boards and while using flexible substrates such as films, for example. Due to the topology described which results from embodiments of the invention, the chip is subjected to a largely uniform mechanical load, unlike the prior art described (flip-chip mounting), so that the likelihood of a defect or failure is reduced.

In embodiments of the invention, a further poorly or non-conductive layer may be deposited on the main surface and/or the first surface of the substrate in the form of a cover layer which covers the metallization layer and the recess. Said cover layer has openings at at least the geometrical regions of the external contact areas. In addition to the cover layer described, a further protective layer may be mounted at least over the geometrical region of the recess, which further protective layer may have a diffusion-impeding property against humidity. For example, said additional protective layer having a diffusion-impeding property may be formed from a metal. In addition, in a further embodiment, a further protective layer, which may also have a diffusion-impeding property, may be mounted on the backside of the substrate, i.e. on that side of the substrate which is opposite the first surface, at least underneath the geometrical region of the recess. One or both of said protective layers may contain a metallization electrically connected to a contact area which may preferably be connected to a ground potential.

In embodiments of the invention, the substrate may have a two-piece layer arrangement; one electrically highly conductive intermediate layer is present on the surface of the other layer at least in the region of the recess which penetrates one of the two layers, so that the backside of a chip may be electrically connected to said intermediate layer by means of an electrically conductive adhesive layer. The electrically highly conductive intermediate layer may extend at least to a region wherein at least one opening is provided in one of the layers, said opening establishing a connection to the conductive intermediate layer. The intermediate layer may be formed from a metal, for example. Said opening in one of the layers, which serves to electrically connect the highly conductive intermediate layer, may be filled with an electrically highly conductive material which either terminates the filling such that it is coplanar with the surface of the substrate layer in a topography-free manner as far as possible, or which slightly projects beyond the surface of the substrate layer. In embodiments, said opening may be filled with a material of a silver-conductive paste.

Thus, embodiments of the present invention provide a chip package wherein a chip, for example a thin chip having a thickness of 10 µm to 15 µm, is located in a recess of a layered laminate, it being possible for the chip to be fully embedded in a polymer material, and for the chip to be preferably arranged in a center plane of the composite layer. The resulting package at the location of the chip is not thicker than the composite material in the surroundings of the chip device, so that it is ensured, by the geometrical conditions within the package, that compressive forces acting on the package from outside are not predominantly directed onto the chip device. On account of the chip being located at the center, only small forces will act upon the sensitive component, since the center line represents a "neutral phase" in the occurrence of bending stress.

Put differently, in that region wherein the chip is arranged and in the regions adjacent thereto, the top and bottom of the chip package have—in embodiments of the invention—a plane-parallel configuration, i.e. they have no topography flatness imperfections of more than 10 µm.

In embodiments, conductive paths for contacting the chip are not implemented until after the chip has been mounted, the geometric adjustment of the contacting conductive paths orienting itself either directly by the positions of the contact areas on the device or by the geometric locations of the corners of the recesses or by the chip corners.

In embodiments of the invention, the package may be implemented, in particular, as a film laminate for very thin chips having thicknesses of 10 µm to 50 µm, which film laminate remains mechanically flexible overall. The film package may have a thickness of only 50 µm to 150 µm. In embodiments of the invention, the entire procedural sequence may be effected in a continuous roll-to-roll process. The placement and mounting of the chip within the recess may also be effected without any precise adjustment if the conductive paths for contacting are aligned in accordance with the position of the chip within the recess. The position of the chip within the recess may be set, via surface-tension forces, in a self-adjusting method such that simply dropping the chip may suffice to ensure a sufficiently accurately defined position of the chip.

In embodiments of the invention, embedding of the chip may be effected in a self-adjusting method by means of a UV-curing dielectric, the chip itself acting as a shadow mask in selective curing. In embodiments of the invention, no pressure treatment is thus performed when producing the chip package, so that any stresses to which the chip is subjected may be reduced.

Embodiments of the invention thus provide a method of producing a chip package wherein a chip is placed into a recess on a flexible substrate so that the chip eventually is located roughly at the center of a composite layer. The chip thickness may be equal to or smaller than the surrounding layer and/or the depth of recess. The remaining border joint may be filled with an initially liquid polymer which will then be cured. Subsequently, metallization may be performed for contacting the chip pads, or chip contacts, once the chip has been placed on the substrate.

Embodiments of the invention enable production of a plane-parallel film laminate which contains a thin semiconductor chip without this resulting in a topographic elevation on the outside of the laminate. In embodiments of the invention, the thickness of the plane-parallel laminate varies by no more than 15 µm or 10 µm. If this process is performed on a film-roll substrate, it will be possible to rewind the laminate following the process steps for embedding the chip without this resulting in a risk of breakage at the chip location. As a result, the roll substrate may be used for further process steps in a likewise continuous method. For example, additional screen-printing methods may be employed to routinely produce passive devices such as resistors or capacitors on the top of the laminate. Display elements, too, may be realized on the laminate without this causing process or material intolerances between the semiconductor device and other electrical or optical elements. The plane-parallel laminate may be used for stacking in order to achieve three-dimensional integration.

In embodiments of the invention, electric contacting may be effected—in the sense of a rewiring process—in thin-film technology, wherein the lithography steps either orient themselves individually by the location of an individual chip or may be executed simultaneously for many chips in a global manner, as it were. The latter is possible, for example, when the edge of the recess is used as an adjustment mark in chip mounting.

A conductive-path thickness, which is decisive for the maximum current-carrying capability, may be configured to meet the specific requirements of the device without having to change the basic process. The conductive-path thickness may be adjusted by means of known electroplating processes, for example by using copper, palladium, nickel, or gold.

In contrast to chips bonded while using an anisotropically conductive adhesive or by using solder, it is also possible to utilize devices without any additional under-bump or bump metallization. This simplifies the processes of providing the chip, which may also have a favorable effect on the cost. In embodiments of the invention, for contacting, a contact via need only be produced through a layer, having a thickness of several micrometers, of the filler material and/or filling dielectric. This is readily possible with photopatternable polymers. However, if one wished to laminate a film over the chip and then wished to produce vias through the film up to the chip contact pads, one would have to create narrow holes in a film having a thickness of about 50 µm. This would be far more difficult to implement.

In embodiments, the filler material is introduced and/or deposited by means of doctor coating, which may result in the metal contact areas being coated on the top of the chip. However, no filler material must ultimately remain on said contact areas since otherwise no electrical contact can be realized. To implement this, a photopatternable filler material may be used which will be detached again later on from the chip frontside. As was described, a UV-curable material may also be used, which is cured with ultraviolet light from the underside, so that any parts of the filler material that are screened off by the chip, are not irradiated and are therefore not cured may be flushed off. A filler material may be applied by means of a stencil printing method instead of the doctor coating, so that no filler material is applied on the top of the chip. In alternative embodiments, the chip may have micro bumps on its contact areas, which micro bumps may have heights of, e.g., 5 µm to 25 µm. Once such a chip has been introduced into the recess, and once a filler material has been applied by doctor-coating, said bumps may protrude beyond the filler material or may only be slightly covered. A short etching process, for example while using a solvent or an etching chemical, on the dried, doctor-coated filler material layer may then detach sufficient filler material so as to superficially expose the bumps, so that they may be used as electrical contacts.

Embodiments of the invention may be employed in a multitude of technical fields of application. Embodiments of the invention are suited for being applied as microelectronic sensors on curved or flexibly deformable surfaces. They may be optical sensors on (e.g. spherically) curved surfaces, which consequently enable focusing of light, or sensors on the skin surface of humans for measuring temperature, humidity and the like. Sensors for measuring deformations or torsions on driving axles of engines or spring suspensions are also feasible while applying the invention.

Embodiments of an inventive film package may also be used for flexible encapsulation of LED devices, in particular for a matrix arrangement of same. In addition, embodiments of the invention may serve to produce film displays; TFT or OLED displays requiring so-called driver chips which distribute the signals to the rows and columns of a matrix display. Said driver chips might be laminated, in a thinned form, into the film directly underneath the display pixels. Thus, the space of many fine conductive paths which otherwise would have to be led into the external area, may be saved. Further embodiments of the present invention may be suited for mounting elastic integrated circuits on the inside of non-planar device housings such as the housings of mobile phones, for example.

Referring to FIGS. 9 to 12, alternative embodiments of the invention are now described, in which am electrically conductive layer is formed on the bottom surface of the recess, wherein a contact area is not provided for on the backside of the chip. In these embodiments, the recess 34 is formed in the first layer 40 of a flexible film substrate also comprising the second layer 42. Comparable to the embodiment described above referring to FIGS. 7A to 7E, an adhesive layer 52 (which may be conductive or non-conductive) is provided on a backside of chip 50 and contact areas 16 are provided on a front side thereof. A passivation layer 18 is also shown in FIGS. 9 to 12.

Figure 9:
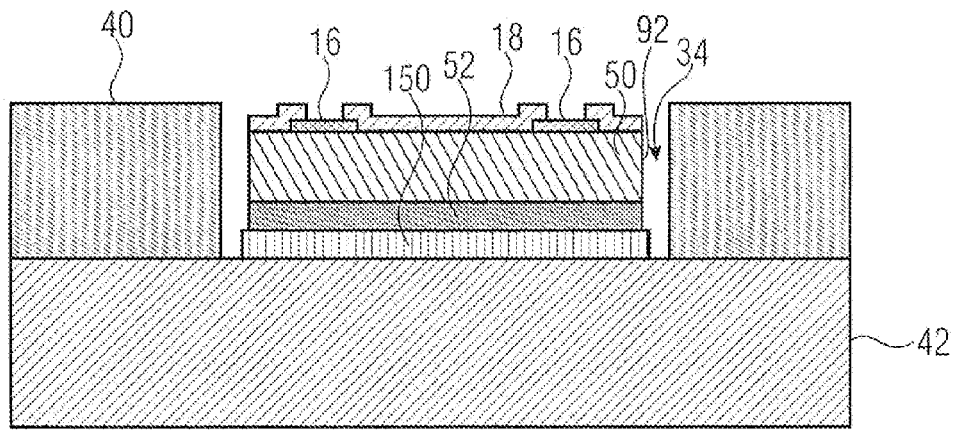
FIGS. 9 to 12 show schematic cross-sectional views of chip packages according to alternative embodiments of the invention.

According to the embodiment shown in FIG. 9, the chip is arranged on a conductive layer 150 arranged on the bottom surface of the recess 34. The conductive layer 150 may be formed by a metallization area. The dimensions of the metallization area may substantially correspond to the dimensions of the chip 50. In embodiments, the dimensions of the conductive area (in a direction parallel to the substrate) may correspond to the dimensions of the chip 50 with a tolerance of about 10%. The bottom surface of the recess 34 may have larger dimensions than the conductive area 150. The conductive area 150 shown in FIG. 9 permits a self-alignment of the chip on top of the conductive area 150 during assembly of the chip package. To this end, a fluorine plasma process is performed at a point in time during the generation of the chip package at which the structured conductive area 150 is exposed on the bottom surface of the cavity 34. Due to the fluorine plasma process, the conductive area 150 is made hydrophile, while the exposed areas of the bottom surface of the recess 35 are made hydrophobe. Thus, a liquid drop (such as non-conductive or conductive adhesive) applied to the conductive area will align on the conductive area. Thereupon, chip 50 is laid down on the drop without precise alignment and, upon hardening of the adhesive, chip 50 is arranged on the conductive area centrally in an automatic manner. Thus, the embodiment shown in FIG. 9 permits for a self-assembly of the chip on the conductive area 150 by means of an adhesive which is applied as a liquid drop during manufacture of the chip package.

Figure 10:
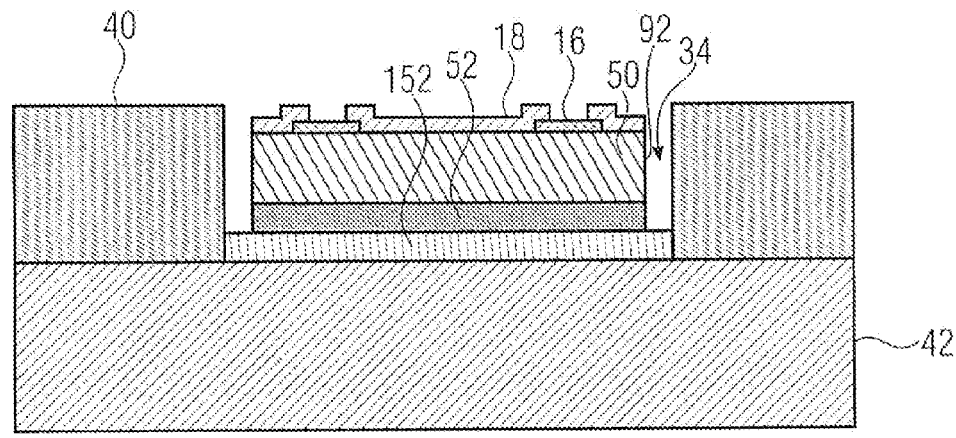

FIG. 10 shows another embodiment, in which a conductive area 152 is arranged on the whole bottom surface of the recess 35. According to FIG. 10, the dimensions of the conductive area, such as a metallization area, correspond to the dimensions of the bottom surface of the recess 34. Coincidence of the conductive area 152 and the bottom surface of recess 34 may be achieved by using conductive area 152 as a mask when photolithographically structuring the first layer 40 of the film substrate. To be more specific, the conductive area 152 is formed on top of the lower foil substrate 42, whereupon the upper dielectric layer 40, which can be structured by a photolithography, is applied. Thereupon, the two layer substrate is exposed without any further mask and the upper layer 40 is developed, i.e. the non-exposed regions are removed. Thus, the recess 34 having exactly the same dimensions as the conductive area 152 is formed. Chip 50 may be mounted on top of the conductive area 152 by means of an electrically conductive or an isolating adhesive.

Figure 11:
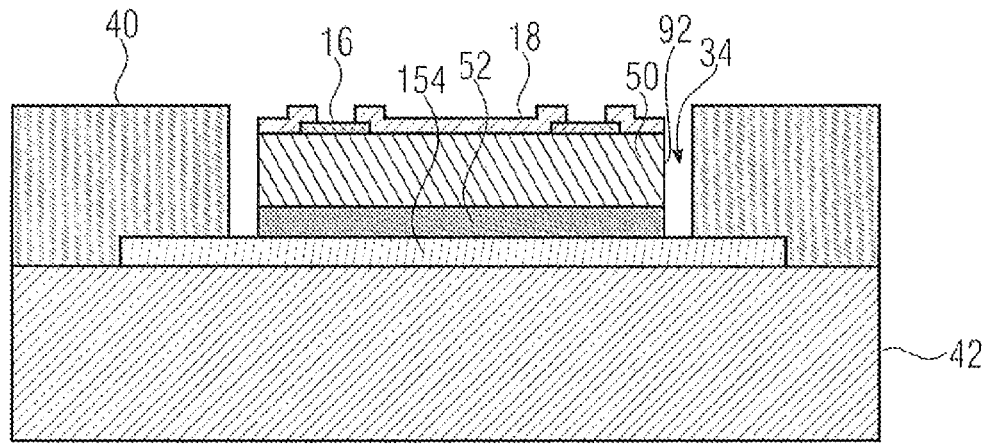

According to the embodiment shown in FIG. 11, a conductive area 154 extending laterally beyond the side faces of recess 34 is formed between layers 40 and 42. Accordingly, the lateral dimensions of conductive area 154 are larger than the lateral dimensions of recess 34. Such an arrangement may be advantageous to provide for an increased heat dissipation. In addition, conductive area (metallization area) 154 may function as a diffusion barrier against humidity or oxygen from the backside of the package. The conductive area 154 may be used for heat dissipation from the chip without the conductive area 154 contacting any contact area of the chip.

Figure 12:
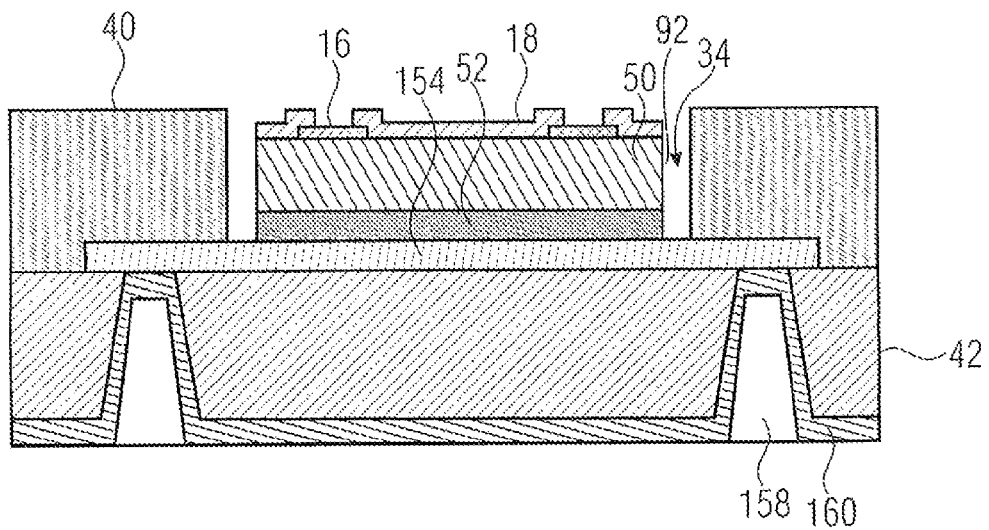

FIG. 12 shows another embodiment, in which openings 185 are formed within the lower layer 42. A conductive material 160 is formed on the backside of lower layer 42 and within the openings 158. Accordingly, vias are formed through the lower layer 42. The vias contact the conductive area 154. Accordingly, conductive area 154 is in contact with metallization layer 160 at least with respect to thermal conductivity, so that a further improved heat dissipation can be achieved from the backside of the chip to the backside of the package via the conductive area 150 and the conductive layer 160. In other embodiments, adhesive layer 52, electrically conductive area 152 and electrically conductive layer 160 may be used to provide for an electrical connection to a contact area on the backside of chip 50. Accordingly, the contact area on the backside of chip 50 may be contacted from the backside of the chip package.

In embodiments of the invention, the lower substrate of a two layer substrate may be formed by a metal foil. In such embodiments, an increased heat dissipation, a secure diffusion barrier and an electrical backside contact may be implemented in an easy manner. Such packages may be particularly advantageous for packages of high power LEDs and the like.

It goes without saying that the additional steps of processing the front side of the packages as far as gap filling, connection to contact areas and encapsulation layers against humidity and oxygen explained above with respect to FIGS. 1 to 8 also apply to the embodiments shown in FIGS. 9 to 11.

While this invention has been described in terms of several embodiments, there are alternations, permutations and equivalents which fall within the scope of this invention. It should also be noted that there are many alternative ways of implementing the methods and compositions of the present invention. It is therefore intended that the following appended claims be interpreted as including all such alterations, permutations and equivalents as falling within the true spirit and scope of the present invention.

The invention claimed is:

1. A method of producing a chip package, comprising:
providing a substrate comprising a recess having a recess bottom and recess side walls in a first surface
introducing a chip, which has a chip backside, into the recess such that the chip does not protrude from the recess and that a gap remains between the recess side walls and the chip, the chip backside being attached to the recess bottom; and
filling the gap with a filler material,
wherein the substrate comprises a flexible one-layer or multi-layer film-roll substrate, wherein the chip comprises a flexible semiconductor chip having a thickness which ranges from 10 µm to 50 µm,
wherein a frontside of the chip, which is opposite the backside of the chip, is set back in relation to the first surface of the substrate, filling the gap comprising filling the recess and providing filler material on the frontside of the chip,
the method further comprising patterning the filler material arranged over the frontside of the chip so as to expose at least one contact area on the frontside of the chip,
wherein a photomask is used for exposing the at least one contact area, adjustment of the photomask being effected on the basis of edges and/or corners of the recess filled with the filler material, on the basis of a position of the at least one contact area, or on the basis of corners of the chip.

2. The method as claimed in claim 1, wherein the filling is performed while using doctor coating.

3. The method as claimed in claim 1, wherein the filling is performed while using a stencil printing method.

4. The method as claimed in claim 1, wherein the filling comprises introducing a liquid material into the gap and subsequent curing of the material.

5. The method as claimed in claim 1, which comprises introducing a liquid adhesive into the recess before the chip is introduced, so that the chip will position itself in a central area of the recess due to capillary forces.

6. The method as claimed in claim 1, wherein the substrate comprises a photopatternable layer, within which the recess is lithographically patterned.

7. The method as claimed in claim 1, wherein the substrate comprises at least two recesses, one chip of identical or different electrical or electronic function(s) being introduced into each of the recesses, respectively, such that it does not protrude from the recess and that a gap remains between the recess walls and the chip, the chip backside being attached to the recess bottom, wherein the gap in each recess is filled with a filler material, the method comprising producing a thin-film wiring metallization, which connects contact areas on the frontsides of the chips, on the first surface of the substrate.

8. The method as claimed in claim 1, further comprising producing a thin-film wiring metallization on the first surface of the substrate, wherein the thin film metallization is connected to at least one contact area on a frontside of the chip opposite to the backside of the chip.

9. The method as claimed in claim 8, further comprising producing a cover layer on the thin-film wiring metallization and on the first surface of the substrate, the cover layer leaving open at least one external contact area of the chip package.

10. The method as claimed in claim 9, further comprising producing a protective layer on the cover layer, the protective layer leaving open at least the external contact area of the chip package, and/or producing a protective layer on the backside of the substrate.

11. The method as claimed in claim 1, wherein the filler material is cured from a second surface of the substrate which is opposite the first surface, so that the chip acts as a shadow mask and parts of the filler material that are arranged on the frontside of the chip are not cured.

12. The method as claimed in claim 1, wherein the chip backside has a contact area arranged thereon which is glued, by means of a conductive adhesive, onto a conductive layer arranged on the recess bottom.

13. The method as claimed in claim 1, wherein the recess bottom and the chip backside are planar, a continuous planar adhesive layer being arranged between the recess bottom and the chip backside.

14. The method as claimed in claim 1, wherein the respective steps for several chip packages are performed in parallel on a film laminate, comprising a step of dicing the film laminate into the individual chip packages.

15. The method as claimed in claim 1, wherein a conductive layer is formed on the recess bottom.

16. A chip package comprising:
a substrate comprising a recess having a recess bottom and recess side walls in a surface thereof, wherein a conductive layer is arranged on the recess bottom; and
a chip having a planar chip backside which is attached to the planar recess bottom, comprising a chip frontside which is opposite the chip backside and does not protrude from the recess, a gap being arranged between the recess side walls and the chip which is filled with a filler material,
wherein the substrate comprises a flexible one-layer or multi-layer substrate, and wherein the chip comprises a flexible semiconductor chip having a thickness which ranges from 10 µm to 75 µm, wherein the chip package further comprises a contact area arranged on the chip backside and connected to the conductive layer via a conductive adhesive, and wherein the substrate comprises a first layer, a second layer and a conductive intermediate layer between the first and second layers, the recess being formed in the first layer and extending to the conductive intermediate layer, the first layer comprising an opening extending, outside the recess, to the conductive intermediate layer and being tilled with a conductive material.

17. The chip package as claimed in claim 16, wherein a continuous planar adhesive layer is arranged between the chip backside and the recess bottom.

18. The chip package as claimed in claim 16 or 17, wherein the filler material is distinguishable from the material of the substrate.

19. The chip package as claimed in claim 16, wherein the substrate comprises a first layer and a second layer, the recess being formed by the first layer rather than by the second layer.

20. The chip package as claimed in claim 16, comprising:
at least one contact area arranged on the frontside of the chip; and
a wiring metallization on that surface of the substrate in which the recess is formed which connects the contact area to an external contact area of the chip package.

21. The chip package as claimed in claim 16, wherein the substrate comprises at least two recesses, one chip of identical or different electrical or electronic function(s) being introduced into each of the recesses, respectively, such that its frontside does not protrude from the recess and that a gap remains between the recess side walls and the chip, the chip backside being attached to the recess bottom, a thin-film wiring metallization, which connects contact areas on the frontsides of the chips, being provided on the first surface of the substrate.

22. The chip package as claimed in claim 20, comprising a cover layer which is arranged on that surface of the substrate which comprises the recess, and on the wiring metallization, and which leaves open at least one external contact area of the chip package.

23. The chip package as claimed in claim 22, further comprising a protective layer on the cover layer, the cover layer leaving open at least the external contact area of the chip package.

24. The chip package as claimed in claim 16, wherein the conductive layer on the recess bottom is not electrically connected to a contact area of the chip.

25. The chip package as claimed in claim 24, wherein the chip does not have a contact area on the backside thereof.

26. The chip package as claimed in claim 16, wherein a chip frontside, which is opposite the chip backside, is coplanar with that surface of the substrate which comprises the recess.

27. The chip package as claimed in claim 16, wherein a chip frontside, which is opposite the chip backside, is set back in relation to that surface of the substrate which comprises the recess, filler material being arranged on the chip frontside, which filler material is patterned such that it does not cover at least one contact area on the chip frontside.

28. The chip package as claimed in claim 16, wherein an area of the substrate which comprises the recess is formed from a material of the following group: benzocyclobutene, polyhydroxystyrene, Ormocer, patternable epoxy resins, polyethyleneterephthalate, polyimide, polyethylenenaphthalate, LCP (liquid crystal polymer), polycarbonate and polystyrene.

29. The chip package as claimed in claim 16, wherein the filler material comprises a material of the following group: photoresist, benzocyclobutene, PHS (polyhydroxystyrene), polyimide, polydimethylsiloxane, Ormocer, adhesive, polymer, resin.

30. The chip package as claimed in claim 16, the top and bottom of which have plane-parallel configurations in that area where the chip is arranged, and in the areas adjacent thereto.

* * * * *